United States Patent
Cheng et al.

(10) Patent No.: US 12,429,775 B2
(45) Date of Patent: *Sep. 30, 2025

(54) DISPENSING NOZZLE DESIGN AND DISPENSING METHOD THEREOF

(71) Applicant: Taiwan Semiconductor Manufacturing Co., Ltd., Hsin-Chu (TW)

(72) Inventors: Wei Chang Cheng, Taichung (TW); Chi-Hung Liao, Taipei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 1 day.

This patent is subject to a terminal disclaimer.

(21) Appl. No.: 18/179,120

(22) Filed: Mar. 6, 2023

(65) Prior Publication Data

US 2023/0205089 A1    Jun. 29, 2023

Related U.S. Application Data

(60) Continuation of application No. 17/203,081, filed on Mar. 16, 2021, now Pat. No. 11,599,026, which is a division of application No. 16/124,579, filed on Sep. 7, 2018, now Pat. No. 10,948,824.

(60) Provisional application No. 62/691,113, filed on Jun. 28, 2018.

(51) Int. Cl.
*G03F 7/16* (2006.01)
*B05B 1/00* (2006.01)
*H01L 21/027* (2006.01)

(52) U.S. Cl.
CPC .............. *G03F 7/162* (2013.01); *B05B 1/005* (2013.01); *H01L 21/0273* (2013.01)

(58) Field of Classification Search
None
See application file for complete search history.

(56) References Cited

U.S. PATENT DOCUMENTS

| | | | |
|---|---|---|---|
| 5,769,946 A * | 6/1998 | Kutsuzawa | B05C 5/0254 |
| | | | 118/321 |
| 5,954,877 A | 9/1999 | Hayes | |
| 6,013,315 A | 1/2000 | Mandal | |
| 10,948,824 B2 * | 3/2021 | Cheng | H01L 21/0273 |
| 2006/0283535 A1 * | 12/2006 | Jeong | B05B 13/041 |
| | | | 156/60 |

(Continued)

FOREIGN PATENT DOCUMENTS

| | | |
|---|---|---|
| CA | 2194453 A1 | 2/1996 |
| JP | 2011018938 A | 1/2011 |

(Continued)

*Primary Examiner* — Alexander M Weddle
(74) *Attorney, Agent, or Firm* — HAYNES AND BOONE, LLP

(57) ABSTRACT

A lithography apparatus includes a wafer chuck configured to hold a wafer, a fluid source configured to contain a fluid to be applied towards the wafer during a lithography process, a dispensing nozzle positioned above the wafer chuck and in fluid communication with the fluid source, the dispensing nozzle having an adjustable cross-section, and a mechanical mechanism operable to apply a force towards an outer surface of the dispensing nozzle to change the adjustable cross-section.

20 Claims, 11 Drawing Sheets

(56) References Cited

U.S. PATENT DOCUMENTS

| | | |
|---|---|---|
| 2008/0014367 A1 | 1/2008 | Charters et al. |
| 2009/0042407 A1 | 2/2009 | Bang et al. |
| 2012/0315378 A1 | 12/2012 | Yapel et al. |
| 2017/0066231 A1 | 3/2017 | DeFillipi et al. |
| 2017/0252773 A1* | 9/2017 | Scharfer ............. H01M 4/0404 |

FOREIGN PATENT DOCUMENTS

| | | | |
|---|---|---|---|
| TW | 162104 | 7/1991 | |
| TW | 290304 A | 5/2006 | |
| TW | 200732051 A | 9/2007 | |
| TW | 201542860 A | 11/2015 | |
| TW | 546201 B | 8/2016 | |
| WO | 2005089955 A1 | 9/2005 | |
| WO | WO-2016037674 A1 * | 3/2016 | ......... B05C 11/1034 |

\* cited by examiner

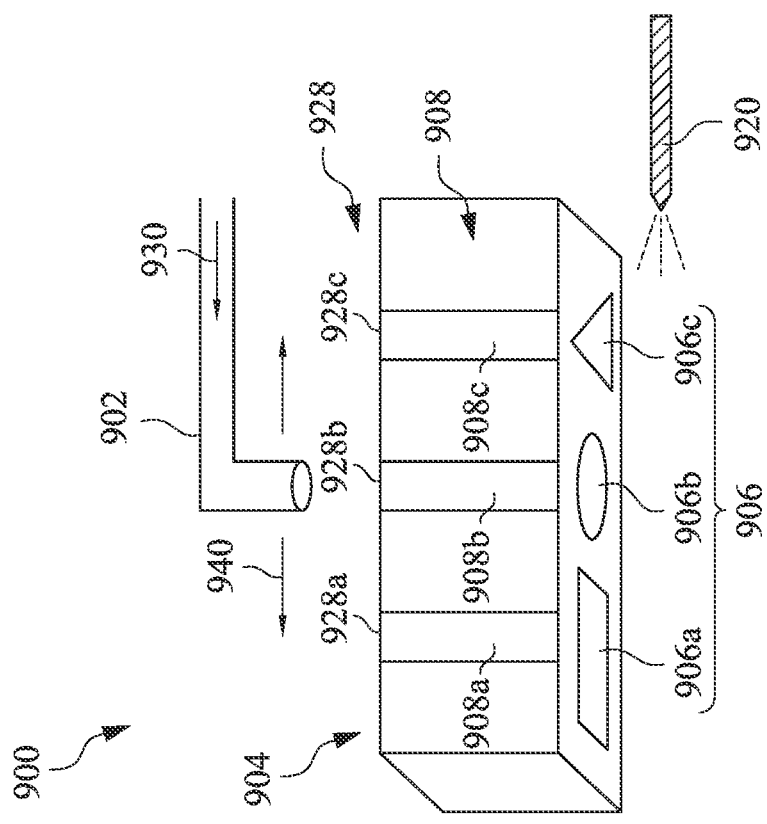
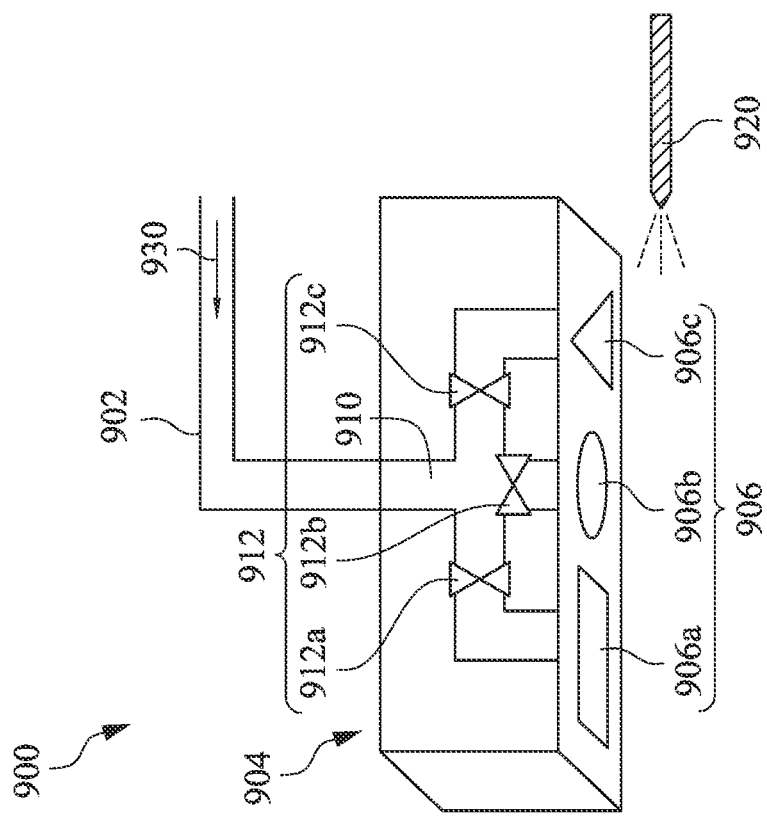
FIG. 9A
FIG. 9B

DISPENSING NOZZLE DESIGN AND DISPENSING METHOD THEREOF

PRIORITY

This is a continuation of U.S. patent application Ser. No. 17/203,081, filed on Mar. 16, 2021, which is a division of U.S. patent application Ser. No. 16/124,579, filed on Sep. 7, 2018, now U.S. Pat. No. 10,948,824, which claims priority to U.S. Provisional Patent Application Ser. No. 62/691,113, filed on Jun. 28, 2018, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As the technology of semiconductor fabrication progresses, the formation of precise photolithographic patterns more relies upon the application of uniform coating of photoresist materials. A uniform coating of photoresist materials is important because thickness variations may impact subsequent processing steps. The photoresist material is a liquid that is coated to form a thin layer on top of a substrate surface, such as on a semiconductor wafer. Several dispensing methods have been employed to apply liquid coating materials onto wafer substrates. In some applications, spinning wafers are flooded with liquid coating materials dispensed from nozzles. The dispensing nozzles often have orifices with circular cross-sections. As presently practiced, however, the fluid flow onto the substrate may not be smooth; the uniformity of the fluid spread during dispense may be poor; and relatively large excess volumes of fluid may be required to achieve acceptable film thickness uniformities, which can also be time consuming. Therefore, a need exists for a nozzle and a method for dispensing liquid coating materials that delivers a uniform coating layer while reducing waste and increasing efficiency.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 9A and 9B illustrate two alternative liquid dispensing apparatus, in accordance with various embodiments of the present disclosure.

DETAILED DESCRIPTION

Figure 1:
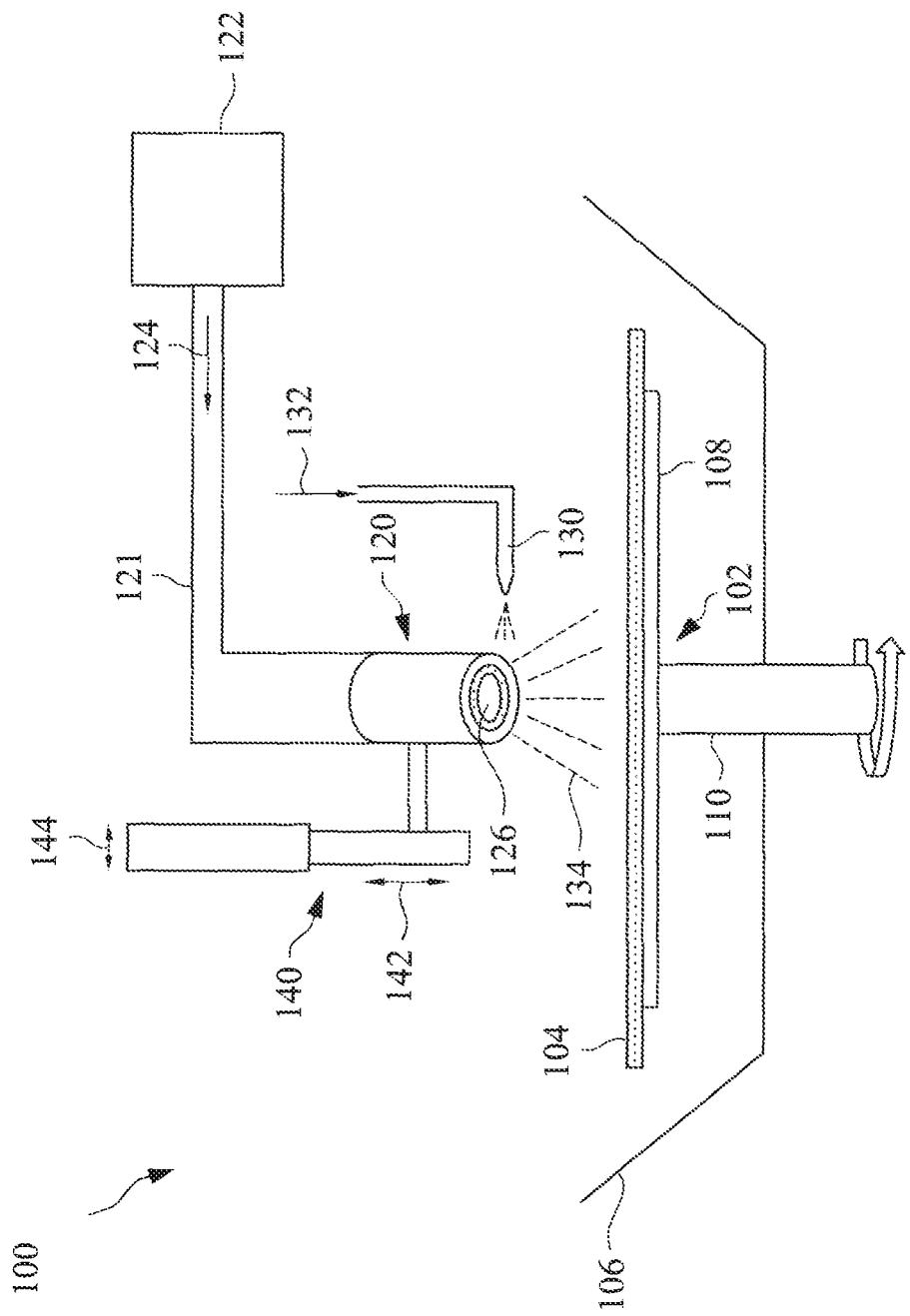
FIG. 1 illustrates a schematic view of a liquid dispensing apparatus, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure in various embodiments is generally related to a nozzle and a method for dispensing liquids onto a surface. More particularly, the present disclosure relates to a fluid dispensing nozzle and method for dispensing process liquids, such as photoresist and developer chemicals, onto a rotating semiconductor substrate. In the present disclosure, the terms "process liquid," "liquid coating material," and "chemical fluid" are used interchangeably.

In manufacturing integrated circuits (IC), a lithography process is used for reproducing layers to form structures on a semiconductor substrate. In some embodiments, as a first step in a lithography process, a photoresist layer is coated onto a semiconductor substrate such that an image can be projected and developed thereon. The photoresist material is a liquid that is coated as a thin layer on top of the substrate. In various processes for applying a photoresist coating material to a substrate, a spin dispensing apparatus is normally used. The spin dispensing apparatus includes a nozzle to spray the liquid coating material from an orifice of the nozzle towards the substrate, and the substrate is spun so that a uniform coating remains on the substrate. One or more materials may be so dispensed and coat the substrate. The backside of the substrate is rinsed, and the coating material is removed from an edge of the substrate. The coating is allowed to dry before it is soft-baked to solidify. An image pattern is then projected onto the photoresist material.

In the developing process, a spin dispensing apparatus is also used. The photoresist material can be either negative tone or positive tone. Regardless of the type of photoresist material, the developer solution dissolves or chemically changes either the exposed portion or unexposed portion of the photoresist material. The developer solution may be dispensed over the substrate in a scan pattern while the substrate spins. Once the chemical reaction takes place, the substrate is rinsed to remove a portion of the photoresist material. The resulting coat pattern is baked to harden and may be used as a mask for an etch step or a deposition step to form a subsequent layer on the substrate.

As the feature sizes decrease for integrated circuits, the quality of the coating and developing becomes more important. Defects may form during the dispensing operations of the coating and/or developing processes. Therefore, improved dispensing apparatus and methods continue to be sought. Depending on the user's applications, some variables to consider in designing a dispensing apparatus include: the separation distance from a nozzle to a substrate thereunder, a rotational speed of a substrate during dispense, a rate of translation of a dispenser arm, fluid temperatures, substrate temperatures, dispensing flow rates, and the rheology of dispensed fluids. Nonetheless, bores and orifices of dispensing nozzles normally have fixed circular cross-sections, out of a scope of tunable variables for optimizing coating and developing processes. The present disclosure provides a dispensing nozzle with adjustable cross-sections. Thus, the shapes and dimensions of the nozzle bores and orifices are adjustable upon applications.

FIG. 1 is a schematic of a spin dispensing apparatus 100 in accordance with various embodiments of the present disclosure. The spin dispensing apparatus 100 includes a circular-shaped, rotatable platform 102 that has a diameter smaller than the diameter of a semiconductor substrate 104. The rotatable platform 102 is positioned in a cup 106 and includes a vacuum chuck 108—vacuum is applied to the platform to hold the semiconductor substrate 104 securely during a spin process. The rotatable platform 102 is positioned in the spin dispensing apparatus 100 such that a semiconductor substrate 104 may be placed on top horizontally. During the coating process, the bottom or uncoated surface of the semiconductor substrate 104 contacts the vacuum chuck 108. A suitable vacuum is applied to the bottom surface of the semiconductor substrate 104 such that it stays securely on the vacuum chuck 108 at high rotational speeds. The rotating motion of the vacuum chuck 108 is achieved by a shaft 110, which is connected to the vacuum chuck 102 and powered by a motor. The motor is capable of rotating the vacuum chuck at different speeds. The cup 106 includes one or more exhausts to which excess liquid coating material flows. The spin dispensing apparatus 100 also includes a dispensing nozzle 120 disposed above the rotatable platform 102. Though a delivery conduit 121, the dispensing nozzle 120 is coupled to a liquid coating material source (or fluid source) 122 that supplies a chemical fluid 124, which may be a photoresist material, a developer, or some other suitable chemical fluids to be dispensed onto and coat the substrate 104. The dispensing nozzle 120 includes an orifice 126 through which the chemical fluid 124 flows. A gas sprayer 130 is also disposed in a proximity region of the orifice 126 and connected to a gas source (not shown) that provides an inert gas 132, which may be nitrogen, helium, argon, or some other suitable inert gases. The inert gas 132 is sprayed laterally towards the orifice 126, which increases an ambient pressure surrounding the chemical fluid 124 that is being sprayed away from the orifice 126. The gas sprayer 130 may use a nozzle as a gas outlet. In that regard, the gas sprayer 130 may also be referred to as the gas outlet nozzle 130. As will be explained in further detail below, by adjusting an ambient pressure in the proximity region of the orifice 126, a conical spraying profile 134 of the chemical fluid leaving the orifice 126 can be fine-tuned, thereby increasing or decreasing a spraying area on the beneath semiconductor substrate 104. The dispensing nozzle 120 is further attached to a dispenser arm 140, which is operable to move in a vertical direction 142 or in a horizontal direction 144. Hence, the dispensing nozzle 120 can be moved to a center region or other peripheral regions above the semiconductor substrate 104. Similarly, a vertical distance from the orifice 126 to the semiconductor substrate 104 can be adjusted by the dispenser arm 140. The vertical distance also affects chemical fluid momentum and spraying area on the semiconductor substrate 104.

One use of a spin dispensing apparatus 100 is to coat a photoresist material on a substrate. In a photoresist coating process in accordance with various embodiments of the present disclosure, a desirable amount of a liquid photoresist material is applied to a top surface of the semiconductor substrate 104 from the liquid dispensing nozzle 120 as the vacuum chuck 108 spins. The photoresist liquid spreads radially outward from a location of the semiconductor substrate 104 where the liquid lands towards the edge until the entire top surface of the semiconductor substrate 104 is covered with a thin layer. Excess photoresist liquid spins off the rotating substrate during the photoresist coating process. The rotational speed of the vacuum chuck and the amount of the photoresist liquid applied can be determined and adjusted prior to and during an application process such that a predetermined, desirable thickness of the photoresist is obtained.

Another use of a spin dispensing apparatus 100 is to develop exposed photo resist material on a substrate. After a photoresist layer is formed, the semiconductor substrate 104 is exposed to a patterned light that affects the chemical properties of the photoresist. When a positive photoresist is used, a portion of the photoresist that is exposed to light becomes soluble to a photoresist developer. When a negative photoresist is used, a portion of the photoresist that is not exposed to light becomes soluble to a photoresist developer. The spin dispensing apparatus 100 may be used to apply a developer to the semiconductor substrate 104. A dispenser arm 140 is mounted on a track while the vacuum chuck 108 is rotated at a dispensing speed. The dispensing nozzle 120 may scan the substrate to ensure even distribution of the developer. The developer and the photoresist are given time to react and then a dissolved portion of the photoresist layer is removed by rinsing. The semiconductor substrate 104 is then dried. Other uses of a spin dispensing apparatus 100 may include, but not limited to, dispensing rinsing chemical in a rinsing process or dispensing slurry in a chemical-mechanical polishing (CMP) process.

Figure 2:
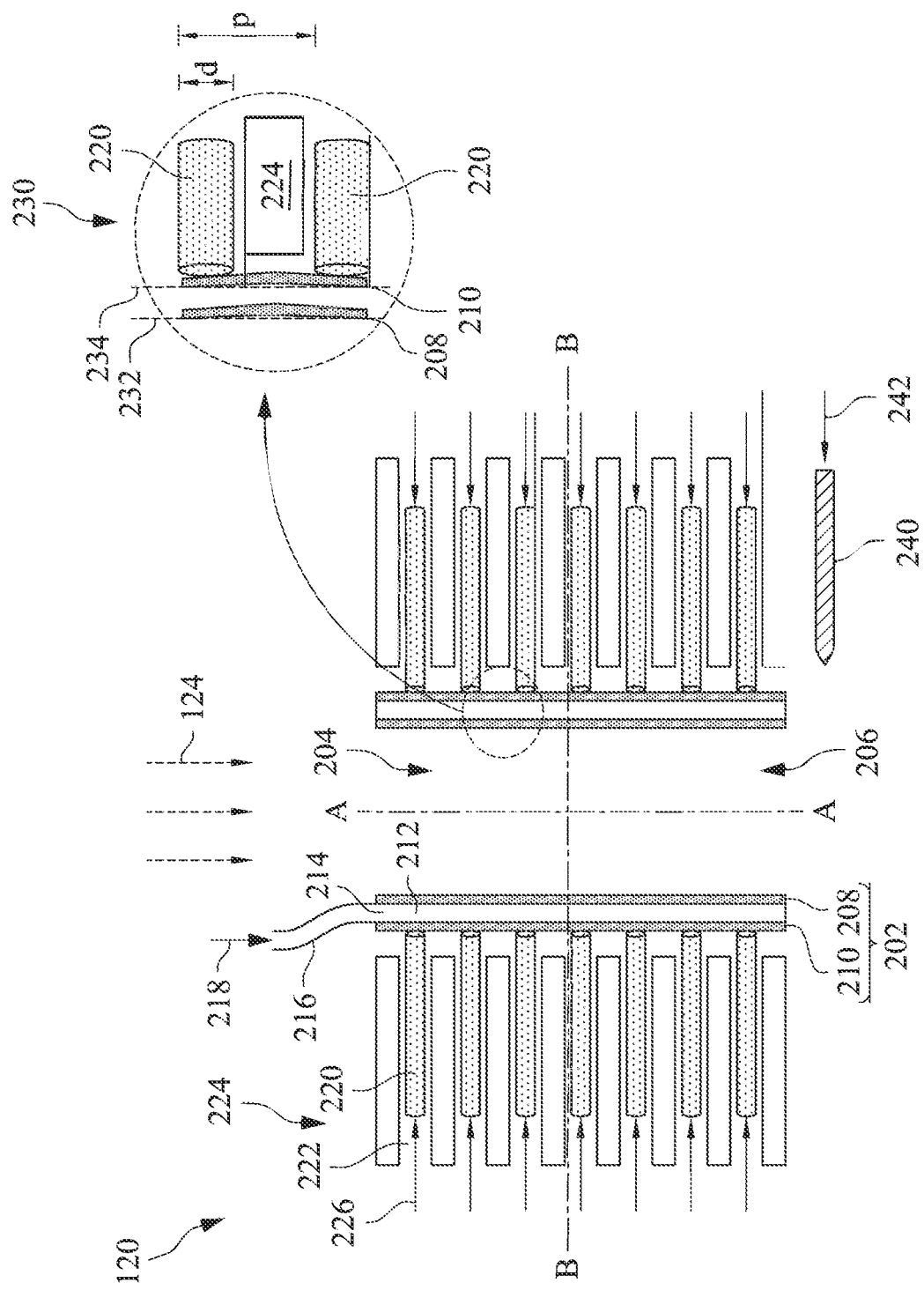
FIG. 2 illustrates a cross-sectional view of a dispensing nozzle that is operable to vary its cross-sections according to aspects of the present disclosure in one or more embodiments.

FIG. 2 shows a cross-sectional view of the dispensing nozzle 120. The dispensing nozzle 120 has a sidewall 202. A central bore 204 is defined within the sidewall 202, which is axisymmetric about a longitudinal axis A-A. The dispensing nozzle 120 is in fluid communication with a fluid source 122 (as shown in FIG. 1). The chemical fluid 124 from the fluid source 122 is pumped into the bore 204 from above and flows downwardly towards the orifice 206. The chemical fluid 124 is subsequently sprayed away through the orifice 206 towards a beneath substrate 104 (as shown in FIG. 1). In some embodiments, the dispensing nozzle 120 further includes a gas sprayer 240 in a proximity region of the orifice 206, which is operable to spray an inert gas 242 laterally towards the orifice 206. The inert gas 242 may include nitrogen, helium, argon, other suitable inert gas, or a combination thereof, such that it does not involve in chemical reactions with the chemical fluid 124. Spraying an inert gas towards the orifice 206 increases the ambient pressure surrounding the orifice 206. The directions of chemical fluid droplets spraying away from the orifice 206 may be influenced by the ambient pressure. The inventors of the present disclosure have observed that extra ambient pressure added to a region surrounding the orifice 206 leads to an expanded spraying profile, and vice versa. Therefore, a spraying area on the beneath substrate 104 can be adjusted by varying the inert gas flow rate from the gas sprayer 240.

The cross-section of the bore 204 (including the orifice 206) also has impacts on fluid dynamics of the chemical fluid 124, including inner pressure, flow rate, and spraying profile. It is advantageous for the dispensing nozzle 120 to be operable to adjust cross-section of the bore 204 beforehand based on material compositions of the chemical fluid 124 and dispensing application requirements, or even to further adjust cross-section on-the-fly during a dispensing operation.

In the illustrated embodiment, the sidewall 202 has an inner layer 208 and an outer layer 210. The inner layer 208 directly faces the bore 204. A cavity 212 is defined between the inner layer 208 and the outer layer 210. The cavity 212 is elsewhere sealed by the inner and outer layers but has an inlet 214 opened to an inflation tube 216. Both inner and outer layers 208, 210 are made of elastic materials, such as elastic plastic films. The elastic materials can be stretched or compressed due to external forces. The inflation tube 216 is coupled to a gas pump (not shown) that provides a gas 218. In some embodiments, the gas 218 includes an inert gas, such as nitrogen, helium, argon, other suitable gases, or a combination thereof. In some embodiments, the gas 218 is air. When the gas 218 is pumped into the cavity 212, the cavity 212 starts to inflate. The inflation forces both the outer layer 210 and the inner layer 208 to expand in a direction away from the longitudinal axis A-A. The outer layer 210 travels in a longer lateral distance than the inner layer 208, effectively enlarging the inflated cavity 212 to accommodate the gas 218. The inner layer 208 travels in a shorter lateral distance than the outer layer 210, while its expansion nonetheless enlarges the bore 204.

In some embodiments, the inner and outer layers 208, 210 are plastic films made of fluorinated ethylene propylene (FEP). FEP is a chemically-resistant material that is not wettable by the fluid being dispensed, which reduces the likelihood of a post-dispense dripping. FEP further has good stability and a high flow rate for injection molding. Alternatively, polytetrafluoroethylene (PTFE) or Perfluoroalkoxy alkanes (PFA) may be used. Both of these materials are chemically inert to most industrial chemicals and solvents. The above-mentioned plastics are also easily molded, yielding smooth molded surfaces for better fluid flow. In one embodiment, the inner and outer layers 208, 210 have different material compositions. For example, the inner layer 208 is made of an FEP film and the outer layer 210 is made of a PTFE film.

Still referring to FIG. 2, the dispensing nozzle 120 further includes a plurality of pins 220. Depending on a vertical distance to the orifice 206, the plurality of pins 220 can be grouped into a stack of multiple layers, where each layer includes the pins at the same vertical distance to the orifice 206. In some embodiments, the pin 220 has a rod shape elongating in a lateral direction perpendicular to the longitudinal axis A-A. Each pin 220 is also movable in the lateral direction perpendicular to the longitudinal axis A-A, along a groove 222 opened in a housing 224. In one embodiment, the movement of the pin 220 along the groove 222 is driven by a mechanism in physical contact with one end of the pin, such as a piston (not shown). In the illustrated embodiment, the movement of the pin 220 is controlled by adding gaseous pressure 226 through an open end of the groove 222. All the grooves 222 are coupled to a gas pump (not shown), which provides a gas to be blown towards the pins 220. In some embodiments, the gas blown towards the pins 220 includes an inert gas, such as nitrogen, helium, argon, other suitable gases, or a combination thereof. In some embodiments, the gas blown towards the pins 220 is air. Each groove 222 also has a valve (not shown) to control the gaseous pressure 226 inside the respective groove 222. The pressure 226 drives the pin 220 to move towards and subsequently in physical contact with the outer layer 210. In other words, the positions of the tips of the pins 220 define a contour for the outer layer 210 to fit in, which in turn defines a cross-section of the inner layer 208 and thereby a cross-section of the bore 204. By increasing the gaseous pressure 226, the pins 220 move further towards the center of the bore 204 and shrink the cross-section of the bore 204. On the other hand, by decreasing the gaseous pressure 226 inside the groove 222, the expansion force from the outer layer 210 will outweigh the gaseous pressure 226 and push back the pin 220 until reaching a new balance position between opposite forces—inflation force and compression force. In this way, the contour defined by the pins 220 is expanded and so does the cross-section of the bore 204. In some embodiments, the gas pump coupled to the grooves 222 can switch to become a suction pump which creates a negative pressure inside the grooves 222 and withdraws the pins 220 away from the bore 204.

Figure 3B:
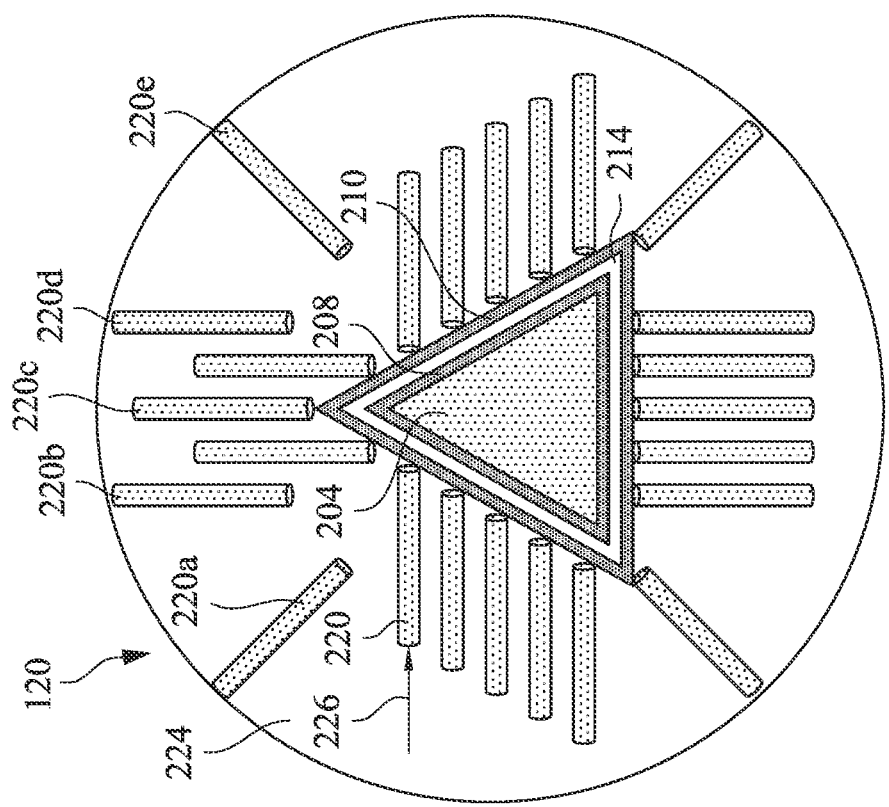
FIGS. 3A, 3B, 3C, and 3D illustrate a top view of a dispensing nozzle that is operable to vary its cross-sections according to aspects of the present disclosure in one or more embodiments.
Figure 3A:
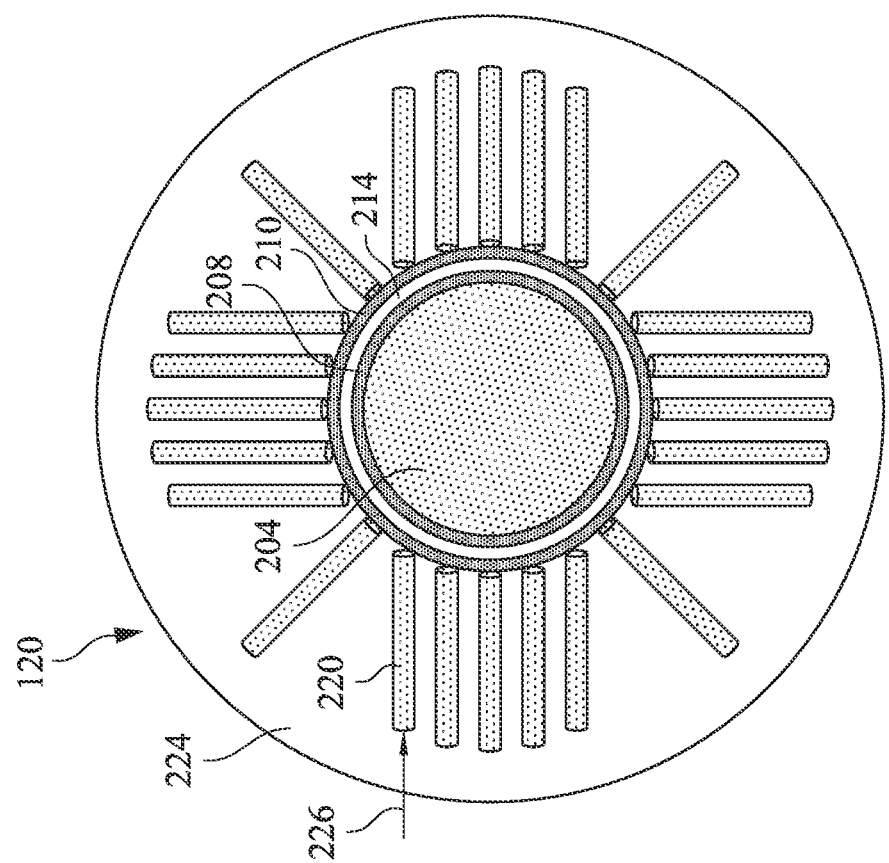
Figure 3C:
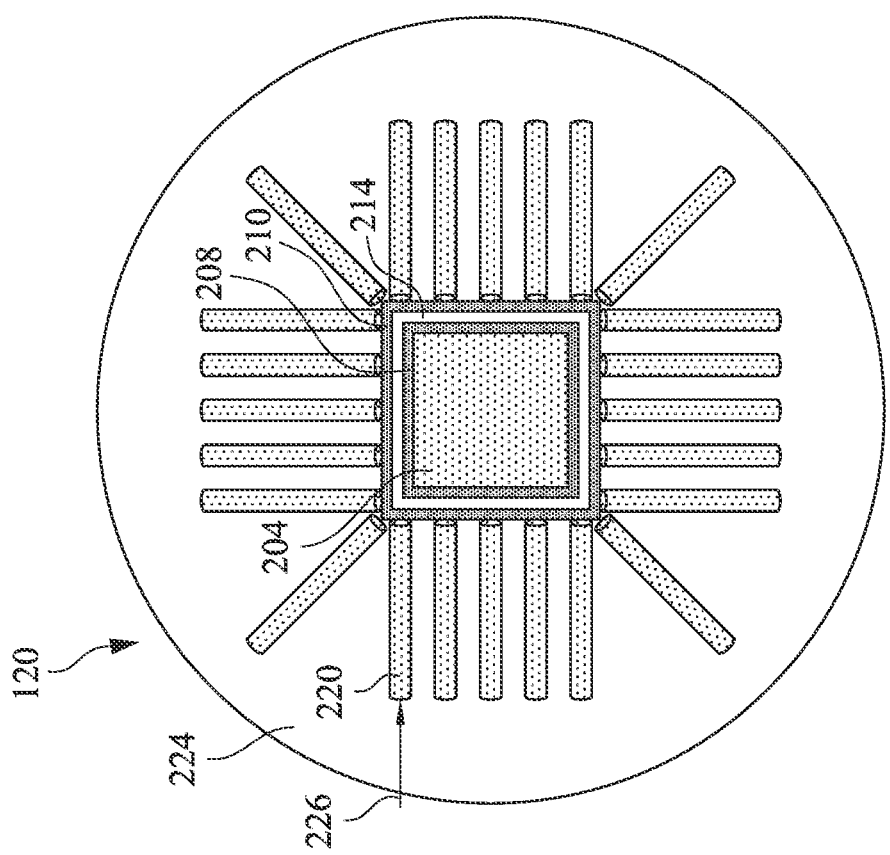

FIG. 3A shows cross-sectional view along B-B line of FIG. 2, which is perpendicular to the longitudinal axis A-A of the dispensing nozzle 120. The pins 220 in the same layer (i.e., with the same vertical distance to the orifice 206 shown in FIG. 2) are allocating along a circumference of the bore 204. The pins 220 are embedded in the housing 224 and driven by the gaseous pressure 226 to slide in respective grooves. By tuning the gaseous pressure 226, each pin 220 is adjusted to a predetermined position, such as forming a circular contour as illustrated in FIG. 3A. Simultaneously, the cavity 212 sealed between the inner layer 208 and the outer layer 210 is inflated by a gas, which causes both sidewalls 208, 210 to expand towards the pins 220 and subsequently confined by the circular contour, thereby forming the bore 204 with a cross-section substantially similar to the contour (e.g., a circular shape). FIGS. 3B and 3C illustrates other shapes, such as a triangle (FIG. 3B) and a square (FIG. 3C), to which the bore 204 can be adjusted. In various embodiments, a cross-section of the bore 204 may be of any shape, such as square, rectangular, circular, oval, polygonal, or even irregular shapes.

Figure 3D:
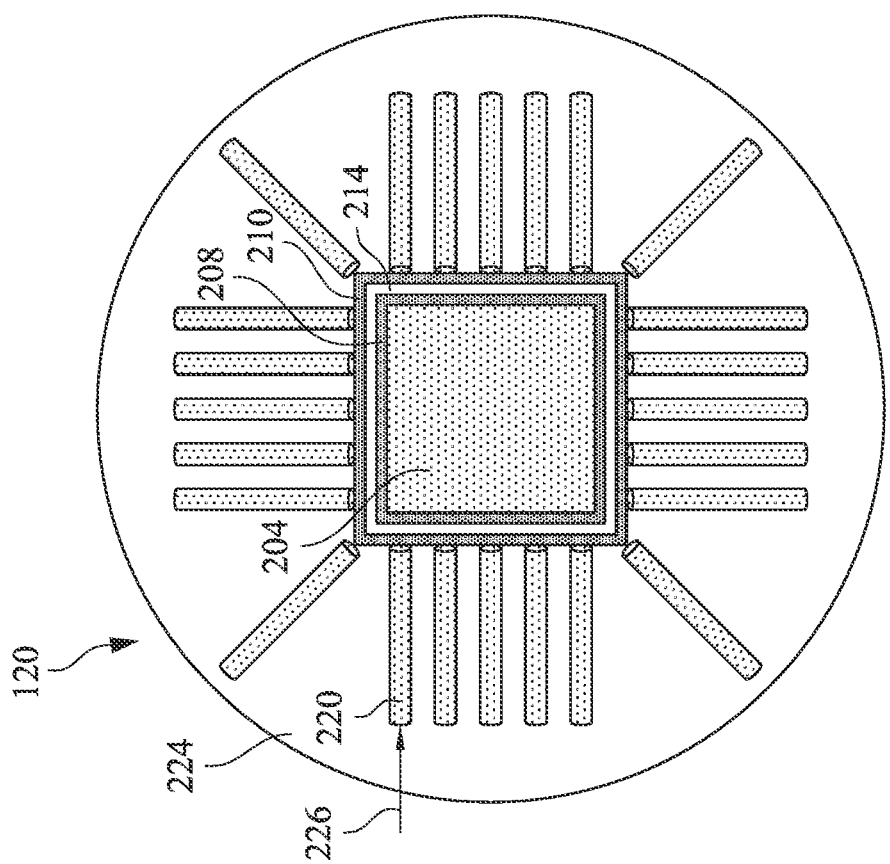

As illustrated in FIG. 3B, to form a determined shape, it is not necessary for all the pins 220 to be in physical contact with the outer layer 210 to form a contour. In FIG. 3B, the pins 220a-e do not participate in forming a contour, therefore these pins can be withdrawn from contacting with the outer layer 210 by applying a suction force to the other end of the respective pins. FIGS. 3C and 3D further illustrate the cross-sectional area of the bore 204 can be increased or decreased while maintaining the same shape (e.g., the illustrated square shape, but not limited to). It is beneficial to vary a cross-sectional area of the bore 204 for dispensing. Smaller the cross-sectional area, stronger the fluid pressure inside the bore 204, which facilitates spraying a chemical fluid with a high viscosity. On the other hand, larger the cross-sectional area, weaker the fluid pressure inside the bore 204, which reduces the likelihood of a post-dispense dripping or further facilitates a "suckback" operation at the tip of the nozzle. "Suckback" is a term used to describe the procedure of chemical fluid slightly withdrawn from the orifice at the conclusion of the fluid dispense to reduce unwanted fluid drops. Varying cross-sectional area can be achieved by moving the pins 220 all-together forward or backward with respect to the outer layer 210.

Referring back to FIG. 2, in some embodiments, each of the inflation tube 216, the grooves 222, and the gas sprayer 240 may be coupled to the same gas pump (not shown) but with a separate gas valve to control each respective gas communication path, since they all may use the same inert gas. In some other embodiments, the inflation tube 216 and the grooves 222 share the same gas pump, while the gas sprayer 240 is using a separate gas pump providing a different gas composition.

FIG. 2 also illustrates an enlarged region 230 proximate to two adjacent pins 220. In some embodiments, the pin 220 is a rod with a length ranging from about 1 mm to about 20 mm and a cross-sectional diameter d less than the length, such as about 2 mm. The two adjacent pins 220 have a pitch p. Since the outer and inner layers 208, 210 are made of elastic material, the outer layer 210 may have a convex portion expanded into a space between the two adjacent pins 220. Consequently, the inner layer 208 will also have a convex portion. Two imaginary vertical lines 232 and 234 parallel to the longitudinal axis A-A are added to contrast with the convex portions of the inner and outer layers 208, 210. From top to bottom, there would be a series of convex portions along both the inner and outer layers 208, 210. The convex portions of the inner layer 208 are more sensitive in affecting a smooth fluid flow than the ones of the outer layer 210. To mitigate the impact of the convex portions, the inner layer 208 may have a larger thickness than the outer layer 210, such as about 20% to about 50% thicker, which makes the inner layer 208 more rigid. In some embodiments, the inner layer 208 is made of a less elastic material than the outer layer 210. Alternatively, smaller pitch p of the pins 220 can also mitigate the convex portions but with a cost of adding more pins and increasing system complexity. The inventors of the present disclosure have discovered that a ratio of p over d in a range from about 2:1 to about 5:1 provides a reasonable balance for mitigating impacts of convex portions and keeping relatively low system complexity.

Figure 4B:
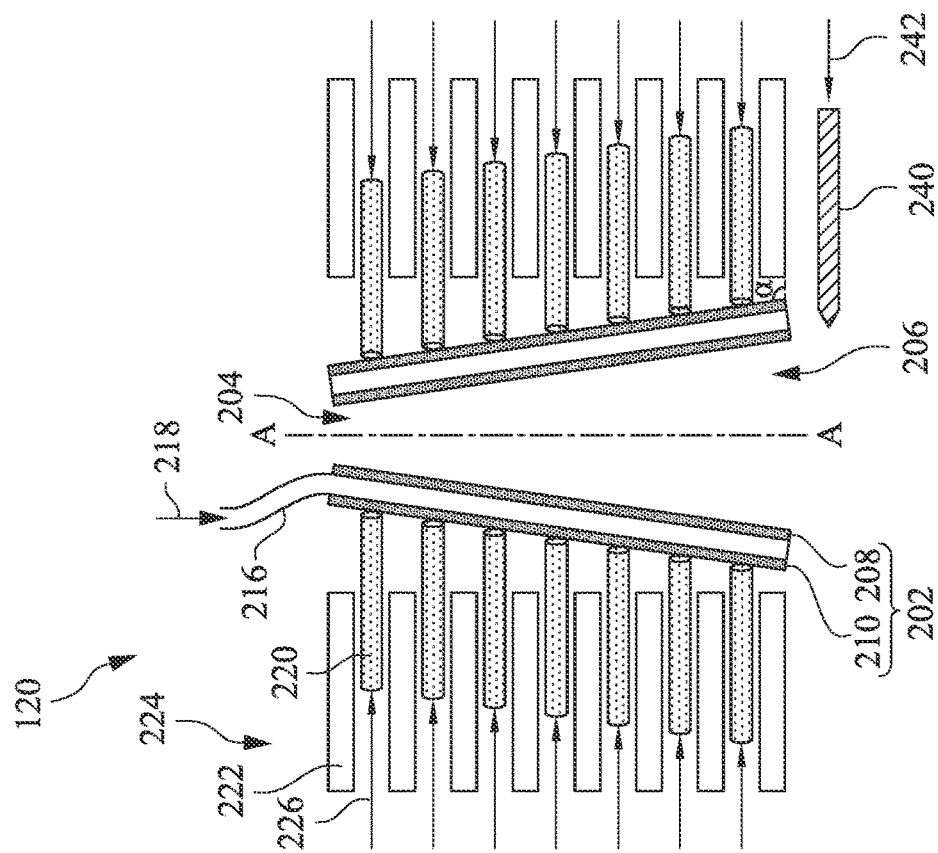
FIGS. 4A and 4B illustrate a cross-sectional view of a dispensing nozzle that is operable to form tapered sidewalls according to aspects of the present disclosure in one or more embodiments.
Figure 4A:
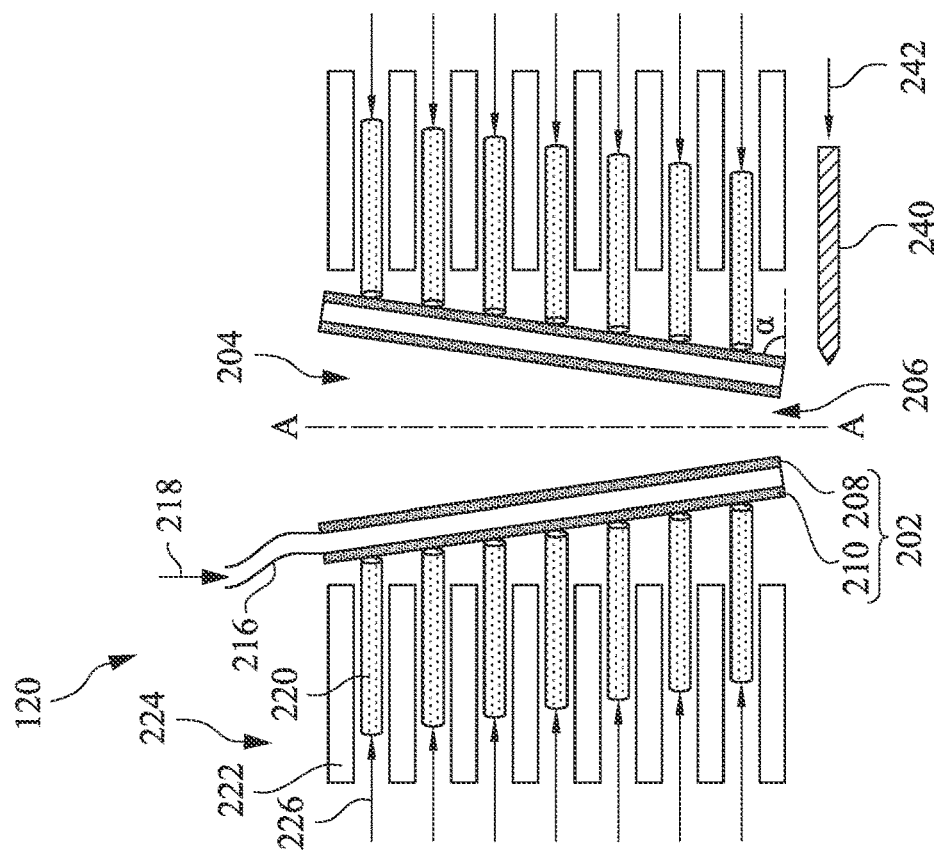

FIGS. 4A and 4B illustrate a cross-sectional view along the longitudinal axis A-A of the dispensing nozzle 120 with a tapered sidewall 202. In some embodiments, the tapered sidewall 202 form an angle with respect to the top surface of the beneath spinning substrate in a range from about 50 degrees to about 130 degrees, such as about 85 degrees in a specific example. With the tapered sidewall 202, the cross-sectional area of the bore 204 at different vertical distance from the orifice 206 varies, similar to a funnel. The cross-sectional area of the bore 204 may gradually shrink towards the orifice 206 (FIG. 4A), which increases fluid pressure to accelerate dispensing velocity. Alternatively, the cross-sectional area of the bore 204 may gradually enlarge towards the orifice 206 (FIG. 4B), which reduces fluid pressure to slow down dispensing velocity and facilitate "suckback" operation. To form the tapered sidewall 202, the gaseous pressure 226 varies in a gradient from top to bottom, causing the pins 220 in different stacked layers to extrude different distances towards the outer layer 210. The tips of the pins 220 form a contour that has a tapered profile for the outer layer 210 to fit in. In some embodiments, the gaseous pressure 226 applied to the topmost pin 220 is about 20 psi, and the gaseous pressure 226 applied to the bottommost pin 220 is about 100 psi (FIG. 4A), or vice versa (FIG. 4B).

In one alternative embodiment, the sidewall 202 includes a single layer instead of the inner and outer double layers. The single layer is made of elastic material, such as an elastic plastic film. The single layer in its natural stretching out conditions will expand beyond the contour line when all pins 220 have been withdrawn into the grooves 222. Therefore, there is no need for using an inflation tube 216 to expand the sidewall 202, as the elastic material always has the tendency to expand itself. Similar to what has been discussed above, to define cross-section of the bore 204, the pins 220 driven by the gaseous pressure 226 to push back the sidewall 202 to a determined position, where expansion force and compression force achieve at a balance at that position. The tips of the pins 220 in the stacked layers collectively define a cross-section profile of the bore 204.

Figure 5:
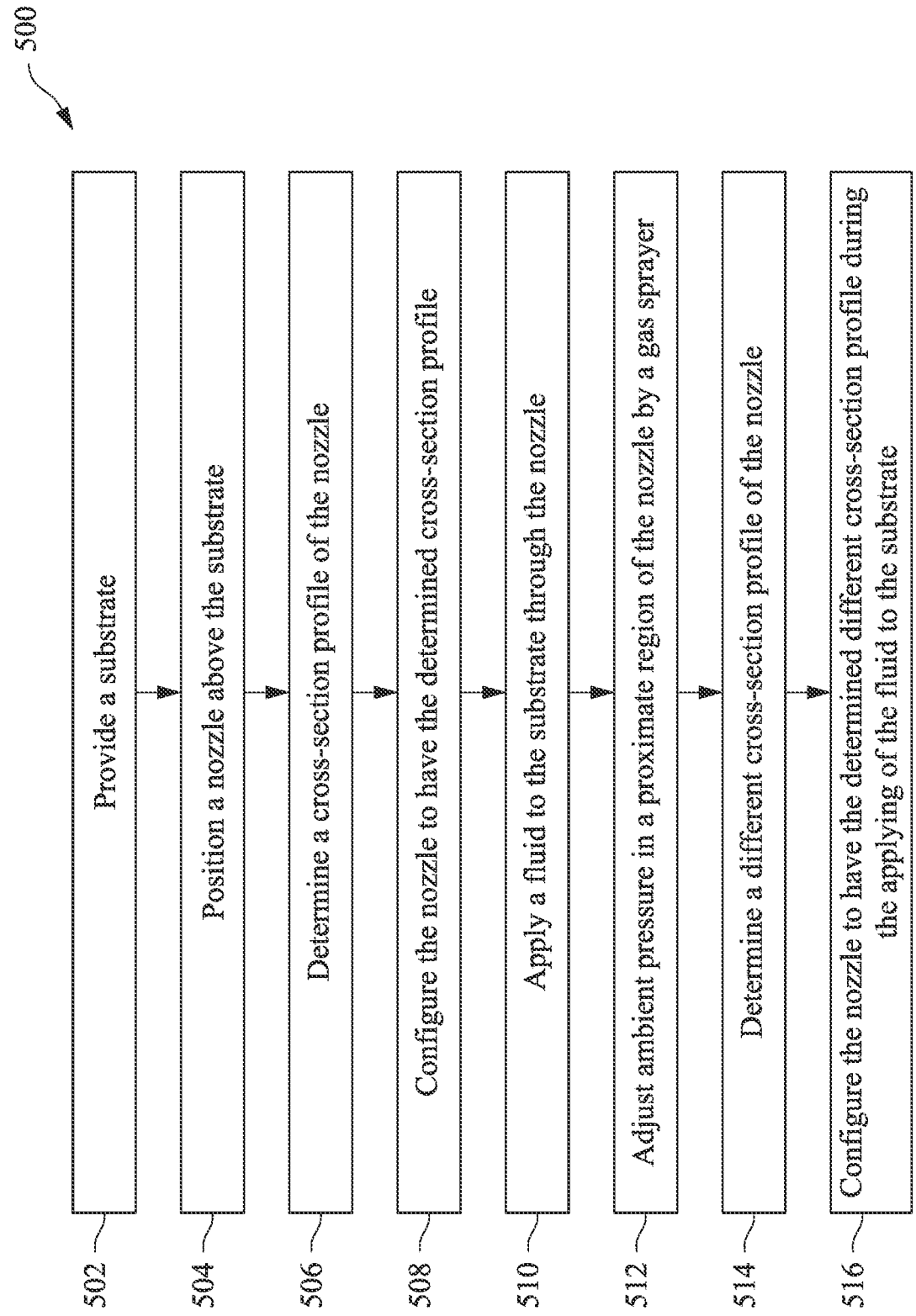
FIG. 5 shows a flow chart of a liquid dispensing method according to various aspects of the present disclosure.
Figure 6:
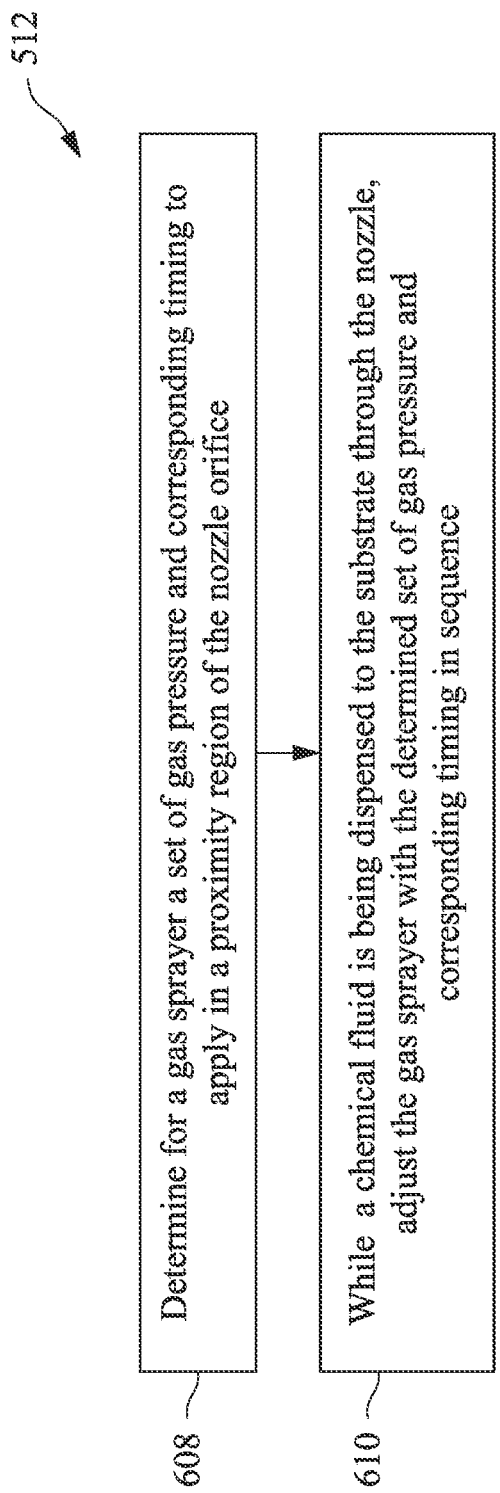
FIG. 6 shows a flow chart of steps in an operation of the method of FIG. 5 according to various aspects of the present disclosure.

FIG. 5 is a flow chart of a method 500 of dispensing chemical fluids in a semiconductor device fabrication process using a spin dispensing apparatus, such as the spin dispensing apparatus 100 illustrated in FIG. 1, according to various aspects of the present disclosure. Additional operations can be provided before, during, and after the method 500, and some operations described can be replaced, eliminated, or relocated for additional embodiments of the method. The method 500 is an example, and is not intended to limit the present disclosure beyond what is explicitly recited in the claims.

The method 500 begins at operation 502 where a substrate is provided. The substrate may be a semiconductor wafer. In an embodiment, the substrate is a 450 mm diameter semiconductor wafer. The substrate provided may be substantially similar to the semiconductor substrate 104, discussed above with reference to FIG. 1. The substrate may be provided to a stage of a spin dispensing apparatus, such as, for example, described above with reference to the vacuum chuck 108.

Figure 7:
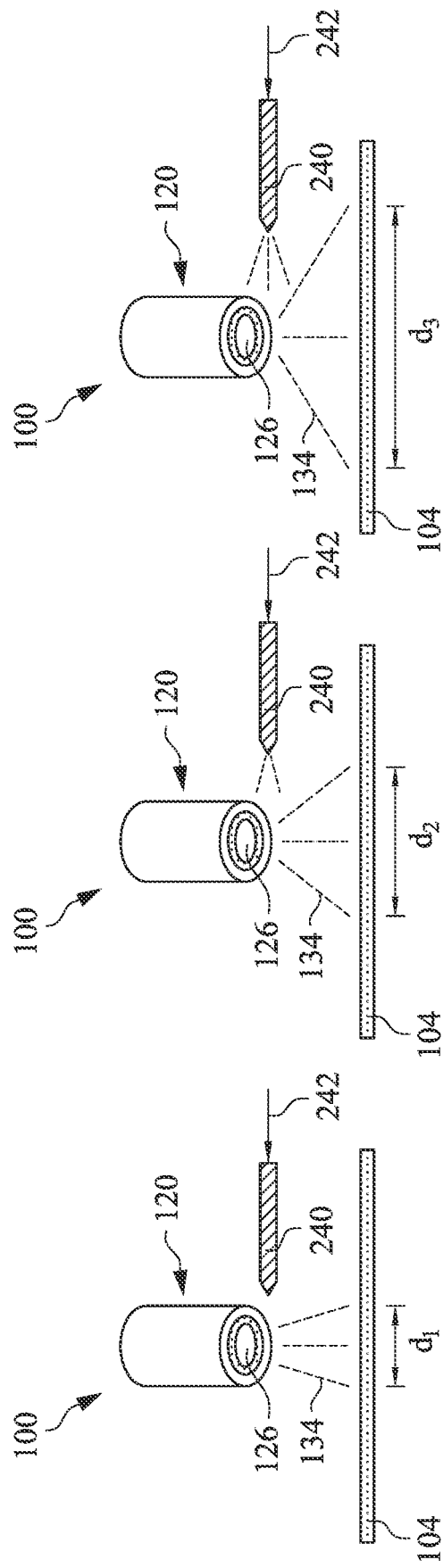
FIGS. 7A, 7B, and 7C shows schematic views of liquid spraying profiles according to the operation of FIG. 6 in one or more embodiments.
Figure 8:
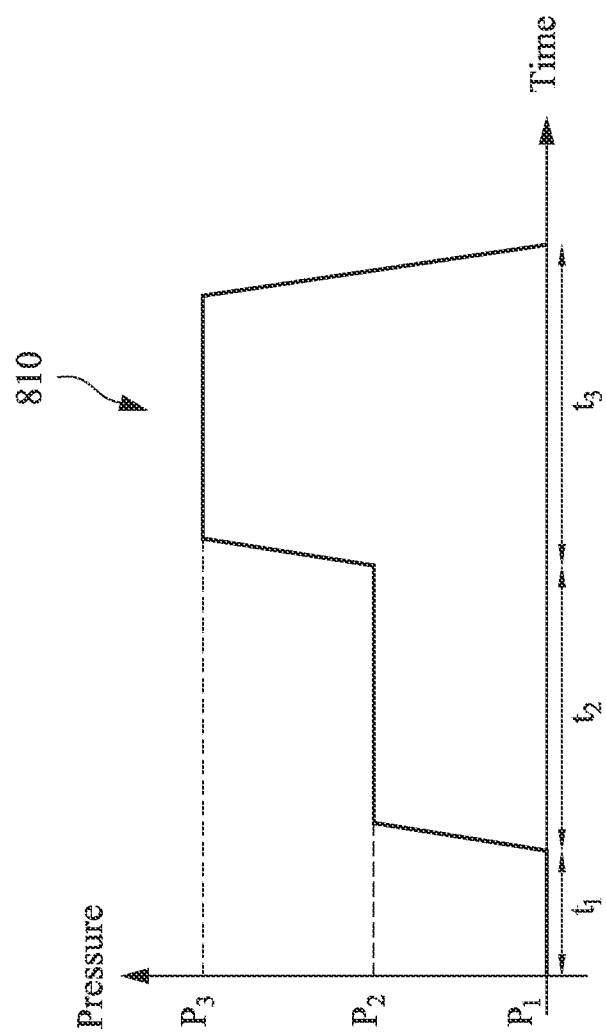
FIG. 8 illustrates a graph of a spraying profile adjustment during a liquid dispensing process, in accordance with an embodiment.

The method 500 then proceeds to operation 504 where a dispensing nozzle is positioned above the substrate. The dispensing nozzle may be substantially similar to the dispensing nozzle 120, discussed above with reference to FIG. 1. FIG. 1 illustrates the nozzle 120 being attached to a dispenser arm 140. The dispenser arm 140 is operable to move vertically or laterally. In some embodiments, either a translational or a rotational dispense arm sweep trajectory, or a combination thereof, may be used during a dispensing process. The nozzle 120 may be position above the center or above the edge of the substrate. The separation distance between the nozzle and the substrate affects momentum of the chemical fluid droplet arriving at the substrate surface. Larger the distance, stronger the momentum and larger the spraying area, and vice versa. In some embodiments, the separation may be less than about 150 mm, for example about 5 mm to about 20 mm, for suitable momentum adjustment of the dispensed chemical fluid.

The method 500 then proceeds to operation 506 where a cross-section profile of the nozzle fluid path, such as the bore 204 illustrated in FIG. 2, is determined for the dispensing process. The cross-section profile determined may include one or more geometrical parameters, such as a shape of the cross-section, a size of the cross-section, substantially vertical or tapered sidewalls of the bore, and a combination thereof. Consideration for determining the cross-section profile may include the chemical fluid compositions to be delivered to and dispersed by the nozzle, the concentration of the chemical fluid, the flow rate of the chemical fluid, the temperature of the chemical fluid, the physical location of the nozzle with respect to the substrate, targeted coating thickness, spinning speed or spinning profile of the shaft, and/or other recipe parameters. In one embodiment, the cross-section of the bore 204 has an oblong shape with rounded corners. In another embodiment, the cross-section of the bore 204 has a square shape with an area tapering down from top to bottom towards the orifice 206. In yet another embodiment, the cross-section of a top portion of the bore 204 starts with a square shape but gradually transits into a circular shape at a bottom portion of the bore 204.

The method 500 then proceeds to operation 508 where the determined cross-section profile is applied to the nozzle. The nozzle has a housing containing a plurality of movable pins substantially similar to the pins 220, discussed above with reference to FIG. 2. The movable pins each can be driven forward or backward by a gas pressure controlled by a gas valve coupled to a gas pump. Tips of the movable pins define a contour, which corresponds to a shape and area determined in the cross-section profile settings. The sidewall of the nozzle is made of elastic material which can be expanded outwardly, such as by pumping in gas, similar to inflate a balloon. The expanding sidewall of the nozzle subsequently comes into physical contacts with the tips of the movable pins and fit in the contour, such that the bore 204 is configured to have the determined cross-section profile.

The method 500 then proceeds to operation 510 where chemical fluid is dispensed to the substrate according to the determined profile set for the nozzle. Example chemical fluid compositions include those chemicals often found used in semiconductor fabrication such as, DI, $SC_1$ (DI, $NH_4OH$, $H_2O_2$), $SC_2$ (DI, HCl, $H_2O_2$), ozonated de-ionized water ($DIWO_3$), SPM ($H_2SO_4$, $H_2O_2$), SOM ($H_2SO_4$, $O_3$), SPOM, $H_3PO_4$, dilute hydrofluoric acid (DHF), HF, HF/EG, $HF/HNO_3$, $NH_4OH$, tetramethylammonium hydroxide (TMAH) or other photosensitive material developer, and/or other suitable chemicals used in semiconductor wafer processing. Example flow rates include those between about 50 sccm and about 5,000 sccm. In some embodiments, the nozzle is held above the spin axis of the wafer substrate, and the chemical fluid is dispensed from the nozzle onto the spin wafer substrate. Once the wafer substrate is flooded with the chemical fluid, it is rapidly accelerated to a predetermined spin speed to spread the chemical fluid into a uniform film at the wanted thickness.

While chemical fluid is being dispensed to the substrate, the method 500 proceeds to operation 512 to adjust ambient pressure in a proximate region of the nozzle by using a gas sprayer. The gas sprayer may be substantially similar to the gas sprayer 240, discussed above with reference to FIG. 2. The gas sprayer is connected to a gas source that provides an inert gas, such as nitrogen, helium, argon, other suitable inert gases, or a combination thereof. The inert gas is sprayed towards the orifice of the nozzle, which increases an ambient pressure surrounding the chemical fluid dispensed away from the orifice. The change of the ambient pressure in the proximity region of the orifice has a direct impact on the conical spraying profile of the chemical fluid droplets leaving the orifice, which in turn varies coverage of a spraying area on the beneath substrate. In some embodiments, operation 512 is optional and can be skipped.

Operation 512 may include multiple steps. FIG. 6 shows an embodiment of operation 512 implemented with the spin dispensing apparatus 100 illustrated in FIGS. 7A-7C. Referring to FIG. 6, operation 512 includes a step 608, which determines a set of gaseous pressure and corresponding timing for a gas sprayer 240 to apply in a proximity region of the orifice 126 of the nozzle 120; and a step 610, which adjusts the gas sprayer 240 with the determined set of gaseous pressure and corresponding timing in sequence on-the-fly with the chemical fluid being dispensed. Referring to FIGS. 7A-7C, one difference between FIGS. 7A, 7B, and 7C is the amount and velocity of the gas 242 sprayed away from the gas sprayer 240, which can be quantified by measuring extra gaseous pressure applied to ambient environment surrounding the orifice 126. A graph 810 in FIG. 8 illustrates that the applied gaseous pressure by the gas sprayer 240 is a function of time (i.e., it is not constant, and it may vary over time or during some periods of time) during the step 610, in accordance with an embodiment. Referring to the graph 810, the step 610 includes a 3-stage flexible adjustment in the illustrated embodiment. The three stages are labeled as $P_1$, $P_2$, and $P_3$, which are also the value to the gaseous pressure applied to the ambient environment surrounding the orifice 126 at each respective stage. Within each stage, the gaseous pressure remains substantially constant. From one stage to a subsequent (the immediately next) stage, the gaseous pressure varies. The three gaseous pressures $P_1$, $P_2$, and $P_3$ may be all different, or some of them may be the same. In an embodiment, it may hold true that $P_1 \neq P_2$ and $P_2 \neq P_3$, but $P_1 = P_3$. Further, the graph 810 shown in FIG. 8 is merely an example of the flexible adjustment of the gas sprayer 240. The various gas pressures and durations may be modified and/or removed, and additional gas pressures and durations may be added or inserted for additional embodiments.

For example, in the illustrated embodiment of the graph 810 shown in FIG. 8, the three gas pressures $P_1$, $P_2$, and $P_3$ have the relationship of $P_1 < P_2 < P_3$, which associates with the dispensing status shown respectively in FIGS. 7A-7C. In FIG. 7A, the gas sprayer 240 shuts off gas supply (e.g., by a gas valve) and has no spray of inert gas 242 towards the orifice 126. Therefore, there is no extra gaseous pressure ($P_1 = 0$) added to the ambient environment of the orifice 126. If the orifice 126 is set to a circular cross-section by the nozzle 120, the chemical fluid sprayed away from the orifice 126 may have a conical spraying profile 134. In one embodiment, the spraying profile 134 is a cylindrical shape. In yet another embodiment, the spraying profile 134 is a funnel shape. Corresponding to the spraying profile 134, a region under the orifice 126 on the top surface of the substrate 104 is wet by the dispensed chemical fluid, which is termed spraying area. In FIG. 7A, the spraying area has a diameter $d_1$. The inventors of the present disclosure have discovered that by increasing ambient pressure the spraying profile 134 will expand outwardly. In FIG. 7B, the gas sprayer 240 sprays the inert gas 242 towards the orifice 126 (e.g., by turning on a gas valve) and thereby adding an extra gaseous pressure ($P_2 > P_1$) to the ambient environment of the orifice 126. The increasing ambient pressure causes the chemical fluid to spray away further outwardly from the center of the orifice 126 and results in an expanded spraying profile 134. The corresponding spraying area on the substrate 104 covered by the spraying profile 134 is also enlarged with an increased diameter $d_2$ ($d_2 > d_1$). In FIG. 7C, the gas sprayer 240 sprays more inert gas 242 with a higher flow rate and momentum towards the orifice 126 (e.g., by fully opening a gas valve) and thereby adding more gaseous pressure ($P_3 > P_2 > P_1$) to the ambient environment of the orifice 126. Similarly, the increasing ambient pressure causes the chemical fluid to spray outwardly even further from the center of the orifice 126 and results in a further expanded spraying profile 134. The corresponding spraying area on the substrate 104 covered by the spraying profile 134 is also enlarged with an increased diameter $d_3$ ($d_3 > d_2 > d_1$). In some embodiments, when the added gaseous pressure exceeds certain amount, the spraying profile 134 may become a conical ring with few chemicals dispensed directly under the orifice 126, and the spraying area on the substrate 104 becomes a circular ring instead of a circle consequently. Generally, as a result of increasing extra ambient pressure from $P_1$ to $P_3$, wider area away from the center of the substrate 104 is wet directly from the dispensed chemical fluid. Compared with other methods by first accumulating excess amount of chemical fluid in a center region then spinning it to peripheral regions, step 610 wets peripheral regions directly during a dispensing process, which increases operation efficiency and reduces fluid waste during a following spinning process.

Referring back to FIG. 5, while chemical fluid is being dispensed to the substrate, the method 500 may optionally proceed to operations 514 and 516. In some embodiments, operations 514 and 516 can be skipped. Operation 514 is substantially similar to operation 506, where a new cross-section profile of the nozzle fluid path is determined for the continuing dispensing process. Operation 516 is substantially similar to operation 508, where the determined new cross-section profile is applied to the nozzle by adjusting positions of movable pins. For example, in one embodiment, the dispensing process starts with a circular shape orifice and transits into a rectangular shape orifice on-the-fly during dispensing when temporally close to an end of the dispensing process, which may help reducing the likelihood of a post-dispense dripping. Similarly, operations 514 and 516 may keep a cross-sectional shape of the fluid path but change its size on-the-fly during dispensing. For example, the dispensing process may start with a rectangular shape orifice (e.g., FIG. 3D) and gradually enlarge the cross-sectional area (e.g., FIG. 3C) while an extra gaseous pressure is being added by a gas sprayer to the ambient environment of the orifice, which may facilitate expanding spraying area on the beneath substrate.

Another embodiment of a dispensing nozzle is illustrated in FIG. 9A. As shown in FIG. 9A, the dispensing nozzle 900 includes a delivery conduit 902 coupled to a fluid source (not shown) that supplies a chemical fluid 930. The dispensing nozzle 900 also includes a dispensing outlet 904. The dispensing outlet 904 includes two or more orifices 906 with different cross-section profile. In the illustrated embodiment in FIG. 9A, the dispensing outlet 904 includes three orifices 906a, 906b, and 906c with different cross-sectional shapes, such as a square, a circle, and a triangle, respectively. In various embodiments, each orifice 906 may individually be of any shape, such as square, rectangular, circular, oval, polygonal, or even irregular shapes. In some embodiments, each orifice 906 may have the same cross-sectional shape but vary in sizes. Each orifice 906 connects to a branch tube 908 (e.g., tubes 908a, 908b, or 908c). All the branch tubes 908 merge into a main tube 910. The main tube 910 directly couples to the delivery conduit 902. Each orifice 906 further associates with an adjustable flow control valve 912 (e.g., valves 912a, 912b, or 912c) installed on respective branch tube 908. The flow control valve 912 controls which orifice to establish a fluid communication path with the delivery conduit 902. For example, in the illustrated embodiment in FIG. 9A, when the flow control valve 912a and 912b are close and the flow control valve 912c is remained open, the chemical fluid 930 flows through the delivery conduit 902, then enters the branch tube 908c, and is subsequently sprayed away from the triangular orifice 906c. Similarly, orifices 906a and 906b may be individually selected for other dispensing applications. The dispensing nozzle 900 may further include a gas sprayer 920 in a proximity region of the orifices 906. The gas sprayer 920 is operable to spray an inert gas to increase an ambient pressure surrounding the orifices 906, which adjusts a spraying profile from the dispensing nozzle 900.

Yet another embodiment of a dispensing nozzle is illustrated in FIG. 9B. Similar to the dispensing nozzle shown in FIG. 9A, the dispensing nozzle 900 in FIG. 9B includes a delivery conduit 902 coupled to a fluid source (not shown) that supplies a chemical fluid 930. The dispensing nozzle 900 also includes a dispensing outlet 904. The dispensing outlet 904 includes two or more orifices 906 with different cross-section profile. In the illustrated embodiment in FIG. 9B, the dispensing outlet includes three orifices 906a, 906b, and 906c with different cross-sectional shapes, such as a square, a circle, and a triangle, respectively. In various embodiments, each orifice 906 may individually be of any shape, such as square, rectangular, circular, oval, polygonal, or even irregular shapes. In some embodiments, each orifice 906 may have the same cross-sectional shape but vary in sizes. Each orifice 906 connects to one end of a branch tube 908 (e.g., tubes 908a, 908b, or 908c). On the other end of the branch tube 908 is an inlet adapter 928 (e.g., inlet adapters 928a, 928b, or 928c). Without using flow control valves in branch tubes to establish a fluid communication path, the delivery conduit 902 is attached to a movable mechanism, such as a robotic arm, a slider, or a rail, which is operable to move the delivery conduit 902 along a direction 940 to above a selected inlet adapter 928 for latching. Once the delivery conduit 902 is physically latched to the selected inlet adapter 928, a fluid communication path is established for the chemical fluid 930 to flow through the delivery conduit 902 to the latched branch tube 908, and subsequently to spray from the corresponding orifice 906. The dispensing nozzle 900 may further include a gas sprayer 920 in a proximity region of the orifices 906. The gas sprayer 920 is operable to spray an inert gas to increase an ambient pressure surrounding the orifices 906, which adjusts a spraying profile of the dispensing nozzle 900.

Figure 10:
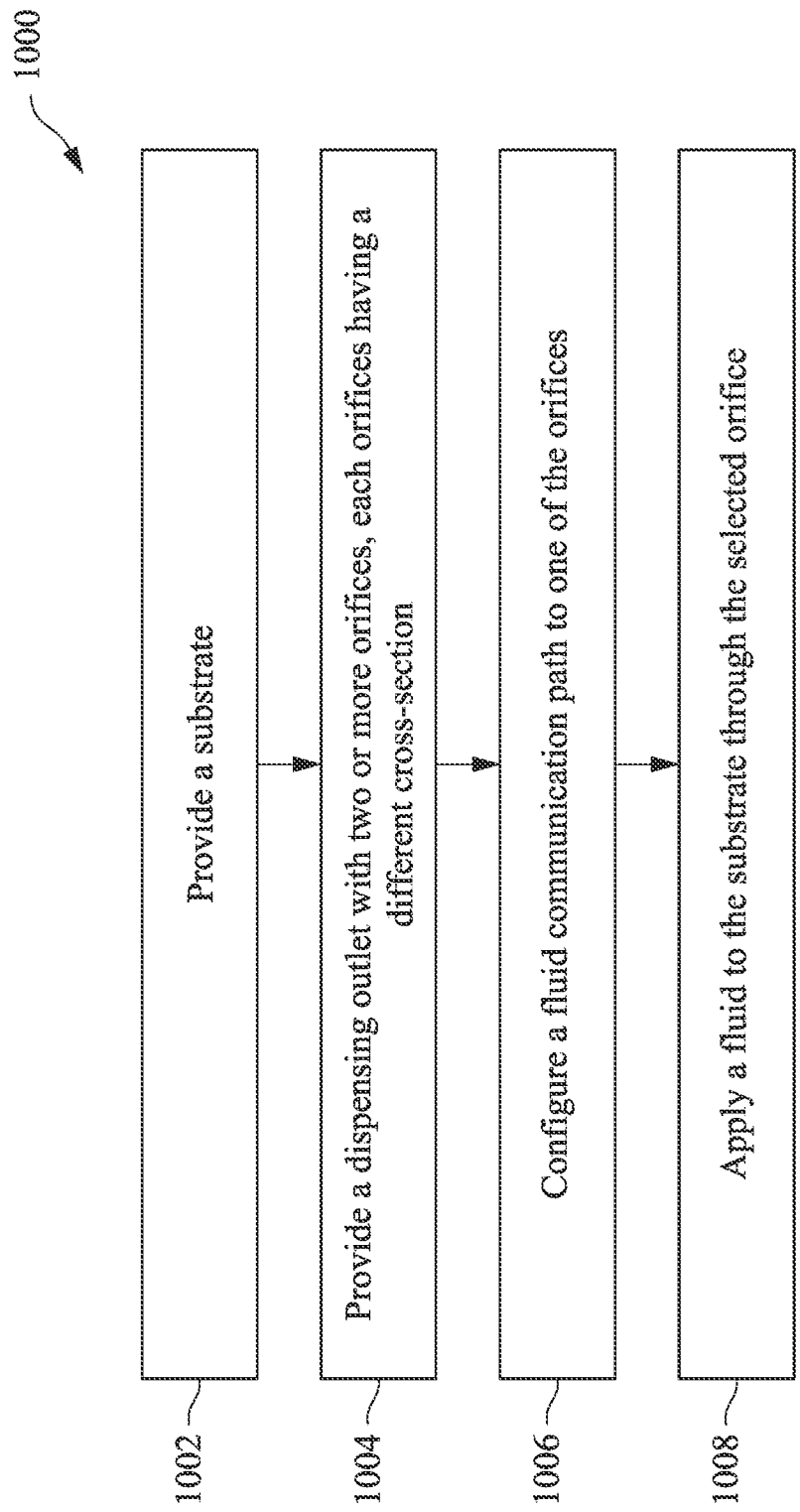
FIG. 10 illustrates a flow chart of a liquid dispensing method according to various aspects of the present disclosure.

FIG. 10 is a flow chart of a method 1000 of dispensing chemical fluids in a semiconductor device fabrication process using a dispensing apparatus, such as the dispensing nozzle 900 illustrated in FIG. 9A or FIG. 9B, according to various aspects of the present disclosure. Additional operations can be provided before, during, and after the method 1000, and some operations described can be replaced, eliminated, or relocated for additional embodiments of the method. The method 1000 is an example, and is not intended to limit the present disclosure beyond what is explicitly recited in the claims.

The method 1000 begins at operation 1002 where a substrate is provided. The substrate may be a semiconductor wafer. In an embodiment, the substrate is a 450 mm diameter semiconductor wafer. The substrate provided may be substantially similar to the semiconductor substrate 104, discussed above with reference to FIG. 1. The substrate may be provided to a stage of a spin dispensing apparatus, such as, for example, described above with reference to the vacuum chuck 108. The method 1000 then proceeds to operation 1004 where a dispensing nozzle is positioned above the substrate. The dispensing nozzle may be substantially similar to the dispensing nozzle 900 in either FIG. 9A or FIG. 9B. The dispensing nozzle 900 includes a dispensing outlet 904 which has two or more orifices 906. The orifices 906 vary in cross-sections, such as in different cross-sectional shapes or different cross-sectional areas. Each orifice is suitable for one specific dispensing recipe. The method 1000 then proceeds to operation 1006 where one of the orifices 906 (e.g., orifice 906a, 906b, or 906c) is picked for establishing a fluid communication path. The fluid communication path may be established by using fluid control valves to shut off branch paths to other orifices (e.g., as shown in FIG. 9A) or by physically connecting a movable delivery conduit 902 to one of the inlet adapters 928 (e.g., inlet adapter 928a, 928b, or 928c) corresponding to the selected orifice (e.g., as shown in FIG. 9B). The method 1000 then proceeds to operation 1008 where chemical fluid is dispensed to the substrate through the established fluid communication path. In some embodiments, the chemical fluid 930 is a photoresist or a photoresist developer used in a photolithography process. In some embodiments, the chemical fluid 930 is a rinsing chemical used in a rinsing process or a slurry used in a CMP process.

Although not intended to be limiting, one or more embodiments of the present disclosure provide many benefits to liquid dispensing processes. For example, embodiments of the present disclosure are capable of adjusting cross-sectional shapes and dimensions of dispensing nozzle bores and orifices upon dispensing recipes. This greatly increases dispensing flexibility and improves coating uniformity across the wafer. In addition, embodiments of the present disclosure enable flexible dispensing system designs and reduce chemical fluid waste.

In one exemplary aspect, the present disclosure is directed to an apparatus for dispensing fluid. The apparatus includes a fluid source; a nozzle having an inner layer and an outer layer, the inner layer defining a bore in fluid communication with the fluid source; and a plurality of pins each movable to be in physical contact with the outer layer, wherein the plurality of pins is operable to apply a force towards the outer layer to adjust a cross-section of the bore. In some embodiments, each of the plurality of pins is movable in a direction perpendicular to a longitudinal axis of the bore. In some embodiments, each of the plurality of pins is movable by applying a gaseous pressure. In some embodiments, the inner and outer layers are made of elastic material. In some embodiments, the elastic material of the inner layer is more rigid than that of the outer layer. In some embodiments, the inner and outer layers form a cavity that can be inflated by pumping in gas. In some embodiments, the cross-section of the bore is adjustable to vary in shapes. In some embodiments, the shapes are selected from triangle, rectangle, square, circle, oval, and polygon. In some embodiments, the cross-section of the bore is adjustable to vary in cross-sectional areas along a longitudinal axis of the bore. In some embodiments, the apparatus also includes a gas outlet nozzle in a proximity region of an orifice of the nozzle, wherein the gas outlet nozzle is operable to increase an ambient pressure in the proximity region. In some embodiments, the apparatus also includes a movable arm attached to the nozzle, the movable arm being operable to move the nozzle horizontally and vertically. In some embodiments, the apparatus also includes a rotatable platform to hold and rotate a substrate to coat with the fluid dispensed from the nozzle.

In another exemplary aspect, the present disclosure is directed to an apparatus for semiconductor manufacturing. The apparatus includes a wafer chuck; a dispensing outlet positioned above the wafer chuck, wherein the dispensing outlet includes at least two orifices, each orifice having a different cross-sectional shape; a delivery conduit coupled to a fluid source, wherein the delivery conduit is operable to couple with one of the at least two orifices for fluid communication; and a gas sprayer in a proximity region of the at least two orifices, wherein the gas sprayer is operable to spray a gas to increase an ambient pressure in the proximity region. In some embodiments, each orifice is controlled by an adjustable flow control valve. In some embodiments, each orifice has a corresponding inlet adapter to mechanically latch to the delivery conduit. In some embodiments, the apparatus also includes a movable mechanism attached to the delivery conduit, the movable mechanism is operable to move the delivery conduit with reference to the dispensing outlet. In some embodiments, the at least two orifices include at least one orifice with a triangular cross-section. In some embodiments, the gas sprayer is operable to vary a flow rate of the gas during a dispensing operation.

In another exemplary aspect, the present disclosure is directed to a method of dispensing fluid. The method includes providing a substrate; positioning a nozzle above the substrate; determining a cross-sectional shape of the nozzle; configuring the nozzle to have the determined cross-sectional shape; and applying a fluid to the substrate through the nozzle with the determined cross-sectional shape. In some embodiments, the method also includes determining a different cross-sectional shape of the nozzle; and configuring the nozzle to have the determined different cross-sectional shape during the applying of the fluid to the substrate.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A lithography apparatus, comprising:
a wafer chuck configured to hold a wafer;
a fluid source configured to contain a fluid to be applied towards the wafer during a lithography process, wherein the wafer chuck is configured to rotate the wafer when the fluid is applied towards the wafer;
a dispensing nozzle positioned above the wafer chuck and in fluid communication with the fluid source, the dispensing nozzle having an adjustable cross-section; and elongated pins operable to apply a force towards an outer surface of the dispensing nozzle to change the adjustable cross-section, wherein at least two of the elongated pins are operable to move along mutually perpendicular directions.

2. The lithography apparatus of claim 1, wherein each of the elongated pins is movable to be in physical contact with the outer surface of the dispensing nozzle.

3. The lithography apparatus of claim 2, wherein each of the elongated pins is movable in a direction perpendicular to a lengthwise direction of the dispensing nozzle.

4. The lithography apparatus of claim 2, wherein the elongated pins are grouped in multiple layers stacked along a lengthwise direction of the dispensing nozzle.

5. The lithography apparatus of claim 1, wherein the elongated pins are operable to change the adjustable cross-section on-the-fly during a dispensing operation of the lithography apparatus.

6. The lithography apparatus of claim 1, wherein the fluid is a photoresist or a photoresist developer.

7. The lithography apparatus of claim 1, wherein a shape of the adjustable cross-section is selected from a triangle, a rectangle, a square, a circle, an oval, or a polygon.

8. The lithography apparatus of claim 1, further comprising:
   a gas sprayer in a proximity region of an orifice of the dispensing nozzle, wherein the gas sprayer is operable to spray a gas to adjust an ambient pressure in the proximity region.

9. The lithography apparatus of claim 8, wherein the gas is an inert gas.

10. The lithography apparatus of claim 1, further comprising:
    a moveable arm attached to the dispensing nozzle, the moveable arm being operable to move the dispensing nozzle horizontally and vertically with respect to the wafer chuck.

11. An apparatus for dispensing a fluid during a lithography process, comprising:
    a wafer chuck;
    a nozzle positioned above the wafer chuck, the nozzle being operable to dispense the fluid towards the wafer chuck, the wafer chuck operable to rotate when the fluid is dispensed, the nozzle including an inner layer and an outer layer, the inner layer defining a bore for the fluid to flow through the nozzle;
    moveable pins operable to apply a force on the outer layer of the nozzle to change a cross-section of the bore, wherein the moveable pins are driven by applying a gaseous pressure, wherein the outer layer separates the moveable pins from the inner layer; and
    a fluid source coupled to the nozzle, the fluid source containing the fluid.

12. The apparatus of claim 11, wherein the inner and outer layers of the nozzle include elastic films made of different material compositions.

13. The apparatus of claim 12, wherein the elastic film of the inner layer is more rigid than that of the outer layer.

14. The apparatus of claim 11, wherein the fluid is a photoresist or a photoresist developer.

15. A lithography apparatus, comprising:
    a wafer chuck;
    a fluid source configured to contain a fluid to be dispensed during a lithography process, wherein the wafer chuck is operable to rotate when the fluid is dispensed;
    a dispensing nozzle in fluid communication with the fluid source, the dispensing nozzle having an adjustable cross-section; and
    movable pins operable to apply a force towards an outer surface of the dispensing nozzle to change the adjustable cross-section, wherein the movable pins include a first pin operable to move along a first direction and a second pin operable to move along a second direction, and wherein the first direction is tilted relative to the second direction when viewed along a lengthwise direction of the dispensing nozzle.

16. The lithography apparatus of claim 15, wherein the movable pins are operable to be in direct contact with the outer surface of the dispensing nozzle or retreated away from the outer surface of the dispensing nozzle.

17. The lithography apparatus of claim 16, wherein the movable pins are driven by applying a gaseous pressure.

18. The lithography apparatus of claim 15, wherein the dispensing nozzle is made of one or more elastic materials.

19. The lithography apparatus of claim 15, further comprising:
    a gas sprayer in a proximity region of an orifice of the dispensing nozzle, wherein the gas sprayer is operable to spray a gas to adjust an ambient pressure in the proximity region.

20. The lithography apparatus of claim 15, wherein the movable pins are operable to apply the force to change the adjustable cross-section when the fluid is dispensed.

* * * * *